(12) United States Patent
Ishikawa (10) Patent No.: US 11,412,649 B2
(45) Date of Patent: Aug. 9, 2022

(54) COMPONENT INSERTION MACHINE AND LEAD CUTTING METHOD

(71) Applicant: FUJI CORPORATION, Chiryu (JP)

(72) Inventor: Kazuma Ishikawa, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 323 days.

(21) Appl. No.: 16/609,035

(22) PCT Filed: May 12, 2017

(86) PCT No.: PCT/JP2017/018044
§ 371 (c)(1),
(2) Date: Oct. 28, 2019

(87) PCT Pub. No.: WO2018/207354
PCT Pub. Date: Nov. 15, 2018

(65) Prior Publication Data
US 2020/0100409 A1  Mar. 26, 2020

(51) Int. Cl.
*H05K 13/04* (2006.01)
*H05K 1/11* (2006.01)

(52) U.S. Cl.
CPC ......... *H05K 13/0473* (2013.01); *H05K 1/115* (2013.01)

(58) Field of Classification Search
CPC .................... H05K 1/115; H05K 13/0473
See application file for complete search history.

(56) References Cited

FOREIGN PATENT DOCUMENTS

| JP | 46-32551 | | 11/1971 |
|---|---|---|---|
| JP | 62-177999 A | * | 8/1987 |
| JP | 07101796 B | * | 3/1989 |
| JP | 2-256298 A | | 10/1990 |
| JP | 10-335898 A | | 12/1998 |
| JP | 10335898 A | * | 12/1998 |
| JP | 2002-171096 A | | 6/2002 |
| JP | 2008-192849 A | | 8/2008 |

OTHER PUBLICATIONS

International Search Report dated Aug. 8, 2017 in PCT/JP2017/018044 filed May 12, 2017.

* cited by examiner

*Primary Examiner* — Carl J Arbes
(74) *Attorney, Agent, or Firm* — Oblon, McClelland, Maier & Neustadt, L.L.P.

(57) ABSTRACT

In a component insertion machine for inserting a component with a lead into a board, when the lead is cut by lead cutting device having a fixed blade 60 and a movable blade prior to insertion, the component is moved to a position where the lead approaches or contacts the fixed blade, at which position the movable blade is operated to cut the lead.

5 Claims, 8 Drawing Sheets

COMPONENT INSERTION MACHINE AND LEAD CUTTING METHOD

TECHNICAL FIELD

The present disclosure relates to a component insertion machine for inserting leads of a component with protruding leads into through-holes of a board, and a method for cutting those leads.

BACKGROUND ART

Among component mounters that mount electronic components, there are machines known as component insertion machines, and with such component insertion machines, components with protruding leads (also referred to as "leaded components") are mounted onto a board by the leads of the components being inserted into holes provided in the board. With such component insertion machines, a lead cutting device is provided to cut the length of the leads. Such a lead cutting device is disclosed, for example, in patent literature 1 below.

CITATION LIST

Patent Literature

Patent Literature 1: JP-A-H10-335898

BRIEF SUMMARY

Technical Problem

With a lead cutting device as described in the patent literature above, it is not defined exactly what kind of mechanism is used to cut leads, but in a case in which leads are cut using two blades while holding a main body section of the component, there is a danger than a lead will be bent by the operation of the two blades. The present disclosure takes account of such circumstances, and an object thereof is to provide a component insertion machine capable of suppressing or preventing bending of a lead when the lead is cut by a lead cutting device, and a lead cutting method capable of suppressing or preventing bending of the lead.

Solution to Problem

To solve the above problems, a component insertion machine of the present disclosure is configured to insert a leaded component into through-holes provided in a board, the component insertion machine including: a component supply device configured to supply the leaded components; a component holding head configured to pick up and hold the leaded component from the component supply device; a head moving device configured to move the component holding head; and a lead cutting device configured to use the head moving device to move a lead of the leaded component near to or contacting a fixed blade and to cut a portion of the lead using a movable blade that faces the fixed blade. Further, a lead cutting method of the present disclosure includes: holding a leaded component; moving the held leaded component so as to move the leaded component close to or in contact with a fixed blade; and cutting a portion of the lead using a movable blade that faces the fixed blade.

Advantageous Effects

According to the present disclosure, when a lead is cut by the lead cutting device, the movable blade operates to cut the lead while the lead is close to or in contact with the fixed blade, thus bending of the lead is effectively suppressed or prevented.

DESCRIPTION OF EMBODIMENTS

Hereinafter, a representative embodiment of the present disclosure is described with reference to the drawings. Note that, in addition to the following embodiments, the present disclosure can be realized in various forms with changes or improvements implemented based on knowledge of someone skilled in the art.

Embodiment

Figure 1:
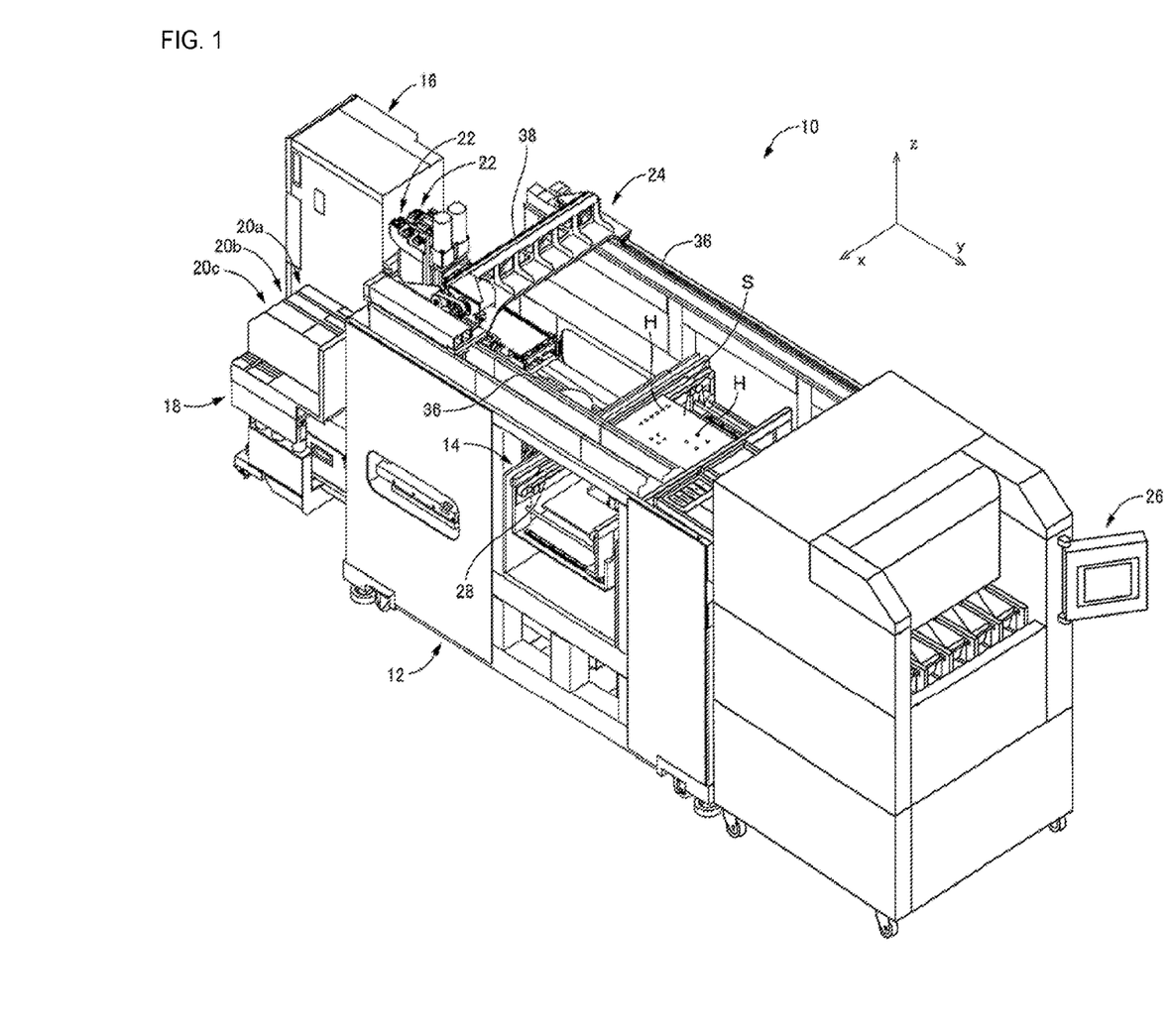
FIG. 1 is a perspective view showing an entire configuration of a component mounter (hereinafter, sometimes referred to as a "component mounter of the embodiment") as a component insertion machine according to an embodiment of the present disclosure.

[A] Overall Configuration and General Functionality and Operation of Component Mounter As shown in FIG. 1, as a component insertion machine of an embodiment, component mounter 10 is configured including: main body 12; substrate holding device 14 arranged on main body 12; component supply device 16 attached to main body 12; three lead cutting devices, 20a, 20b, and 20c (also referred to as "lead cutting device 20" when there is no need to distinguish between the three) loaded on table 18 attached to main body 12; two mounting heads 22 that each configure a component holding head; head moving device 24 supported on main body 12 and configured to move mounting heads 22 in XY directions shown in the figures; and control device 26 configured to control each device (which also includes the mounting heads).

To further describe each device: substrate holding device 14 is provided with conveyor 28, and has functions to load and unload substrate S that is a board to and from component mounter 10, and to fix and hold the loaded substrate S at a specified work position. Component supply device 16 is a conventional tray-type component supply device, and although not explicitly shown, is configured to deliver multiple components, with the components being lined up in a tray. Note that, in component mounter 10 of the present embodiment, as will be described later, in order to handle a leaded component that has a lead extending from a component main body section, the leaded components (hereinafter, sometimes referred to simply as "component") are supplied from component supply device 16.

The three lead cutting devices 20, each of which has a function of cutting leads of a component, are aligned in the X direction on table 18 using multiple slots provided thereon. With component mounter 10 of the present embodiment, as will be described later, three types of leaded components are mounted, and three lead cutting devices 20 are arranged corresponding to these three types of components. The configuration of lead cutting devices 20 will be described in detail later.

Figure 2:
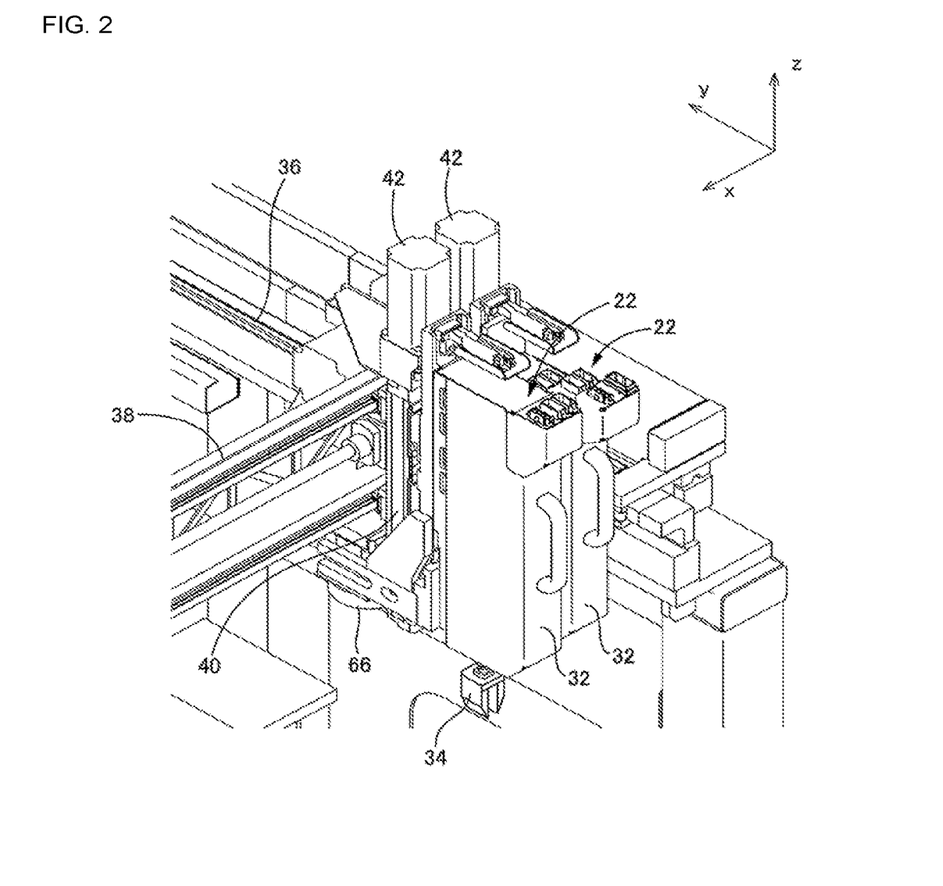
FIG. 2 is a perspective view showing a mounting head of the component mounter of the embodiment from the opposite side to FIG. 1.

Referring also to FIG. 2, mounting head 22 is provided with head main body 32 and component chuck (also referred to as "component clamp") 34 as a component holding device that is provided below head main body 32 to grip and hold a component. In other words, mounting head 22 picks up and holds a component using component chuck 34. In addition, although not shown in the figure, provided internally is a chuck raising and lowering device that moves component chuck 34 in the Z direction, that is, up and down, and a chuck rotating device that rotates component chuck 34 around an axis line extending in the Z direction.

Head moving device 24 is a moving device of a so-called XY-robot type, and includes two guide rails 36 supported by main body 12 so as to be aligned in the X direction, that is, in the width direction of component mounting machine 10 and each extending in the Y direction, beam 38 arranged in a posture extending in the X direction across the guide rails 36, a beam moving device (not shown) for moving beam 38 along the guide rails 36 in the Y direction, two slides 40 movable along beam 38, and a slide moving device (not shown) for moving the two slides 40 individually in the X direction. One of the two mounting heads 22 is mounted on one of the two slides 40 and the other of the two mounting heads 22 is mounted on the other of the two slides 40, via head raising and lowering device 42 that is configured to raise and lower one of the two mounting heads 22.

According to the above configuration, with component mounter 10 of the present embodiment, a chuck moving device for moving component chuck 34 is configured including a chuck raising and lowering device, a chuck rotating device, head raising and lowering device 42, and head moving device 24, and the chuck moving device functions as a device moving device for moving component chuck 34 as the component holding device over substrate holding device 14, component supply device 16, and lead cutting device 20.

Control device 26 includes a computer as a main component, and controls component mounter 10. In detail, control device 26 controls various devices such as substrate holding device 14, component supply device 16, lead cutting device 20, mounting head 22, head moving device 24, and head raising and lowering device 42.

Figure 3:
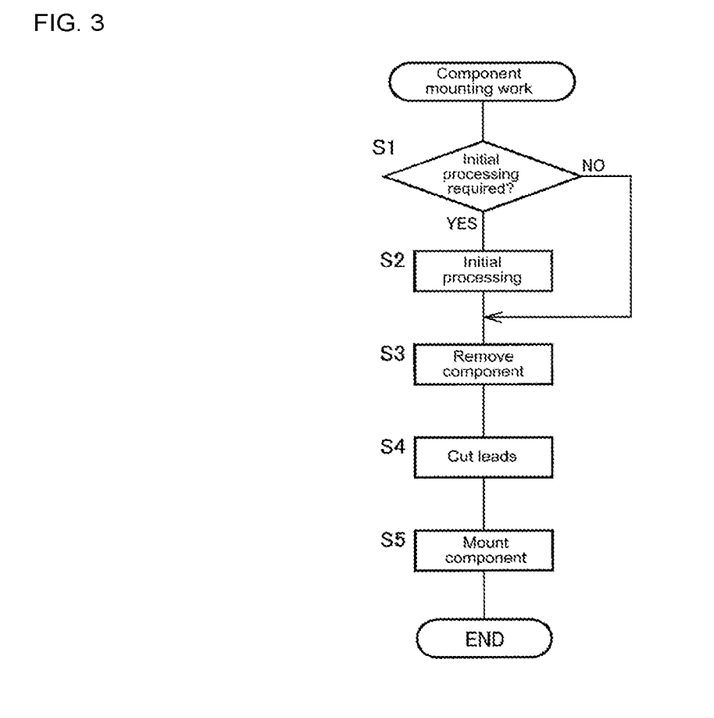
FIG. 3 is a flowchart for illustrating component mounting work of the component mounter of the embodiment for mounting one leaded component onto a substrate.

A series of component mounting operations are performed by controlling the respective devices using control device 26. Component mounting operations for a single component are described below with reference to the flowchart of FIG. 3, starting with step 1 (shortened to "S1" below, which also applies to the other steps), in which it is determined whether initial processing is required, and in case in which initial processing is required, in S2, initial processing is performed. This initial processing will be described later.

Figure 4:
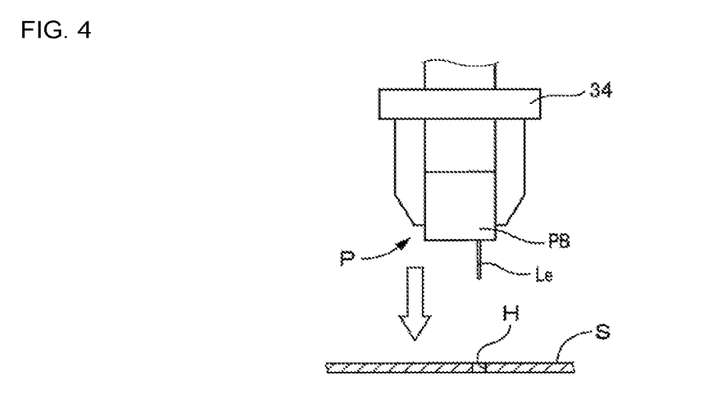
FIG. 4 shows a state in which a component chuck provided on the mounting head is holding a leaded component at a position above a substrate.

If initial processing is not necessary, S2 is skipped, and if initial processing is necessary, after S2 has been executed, the component is removed in S3. With this removal, mounting head 22 is moved by head moving device 24 to component supply device 16, component chuck 34 is lowered by the chuck raising and lowering device and the head raising and lowering device 42 described above, and one component accommodated in the tray is held (gripped) by component chuck 34. FIG. 4 shows a state in which the component P (in detail, component Pa, which will be described later) is mounted on substrate S, and as shown in this figure, component chuck 34 holds component P so as to grasp component main body portion PB in a position in which the lead Le extends downward. Note that, component chuck 34, that is, the member that moves and raises and lowers the component P, is head moving device 24, the chuck raising and lowering device, and head raising and lowering device 42; however, in order to avoid complexity, references to these components are omitted in the following descriptions.

Continuing, in S4, as shown in FIG. 4, component chuck 34, which has been raised while holding the component P, is moved to the position of lead cutting device 20, and is lowered to a set position, such that lead Le of the held lead-ed component P is cut. In detail, the tip portion of lead Le is cut so that lead Le having a set length remains. That is, lead Le is trimmed. The configuration of lead cutting device 20 and the cutting of lead Le by leading cutting device 20 will be described in detail later.

Next, in S5, component chuck 34 holding the component with lead P for which lead Le has been cut is moved to a position above substrate holding device 14, that is, a position above substrate S where the component P is to be mounted, and lead Le of component P is lowered so as to be inserted into the hole (through-hole) H (see also FIG. 1) drilled in substrate S, and the holding of component P by component chuck 34 is released in the lowered condition, so as to perform the mounting of the single component P.

[B] Configuration of Lead Cutting Device

Figure 5:
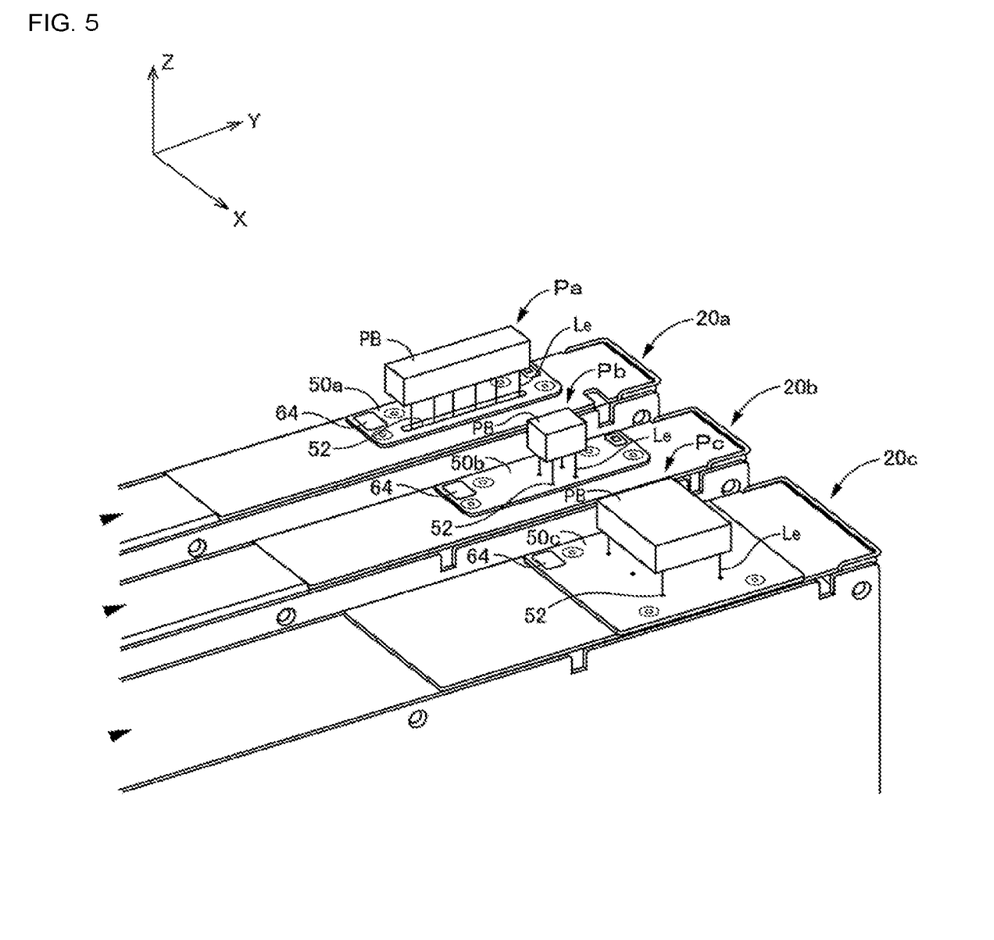
FIG. 5 is a perspective view showing an external view of a portion of a lead cutting device provided on a component mounter of the embodiment.

As shown in FIG. 5, the three lead cutting devices, 20a, 20b, and 20c, are each configured to cut lead Le of a different type of component P. Assuming that these components are referred to as component Pa, component Pb, and component Pc: component Pa for which leads Le are cut using lead cutting device 20a is a component with six leads Le extending straight from and lined up on component main body section PB, and components Pb and Pc for which leads Le are cut using lead cutting devices 20b and 20c are components of different sizes and shapes and with four leads Le at different positions that extend from component main body PB and which are positioned at the four corners of the rectangular components.

Removable attachment plates (also referred to simply as "plates") 50a, 50b, and 50c are respectively attached to an upper section of lead cutting devices 20a, 20b, 20c, and through-holes 52 are formed in plates 50a, 50b, and 50c based on components Pa, Pb, and Pc, that is, in accordance with the arrangement position of leads Le. Leads Le of component P are cut in a state with the leads Le inserted into through-holes 52. Note that, with lead cutting device 20a that cuts leads Le of component Pa, one through-hole 52, which is a long hole into which six leads Le can be inserted, is provided in plate 50a, and with lead cutting devices 20b and 20c that cut leads Le of components Pb and Pc, four through-holes 52, into which four leads Le can be inserted, are provided in plates 50b and 50c, respectively. In the following description, if there is no need to distinguish between plates 50a, 50b, and 50c, they are collectively referred to as plate 50.

Figure 6:
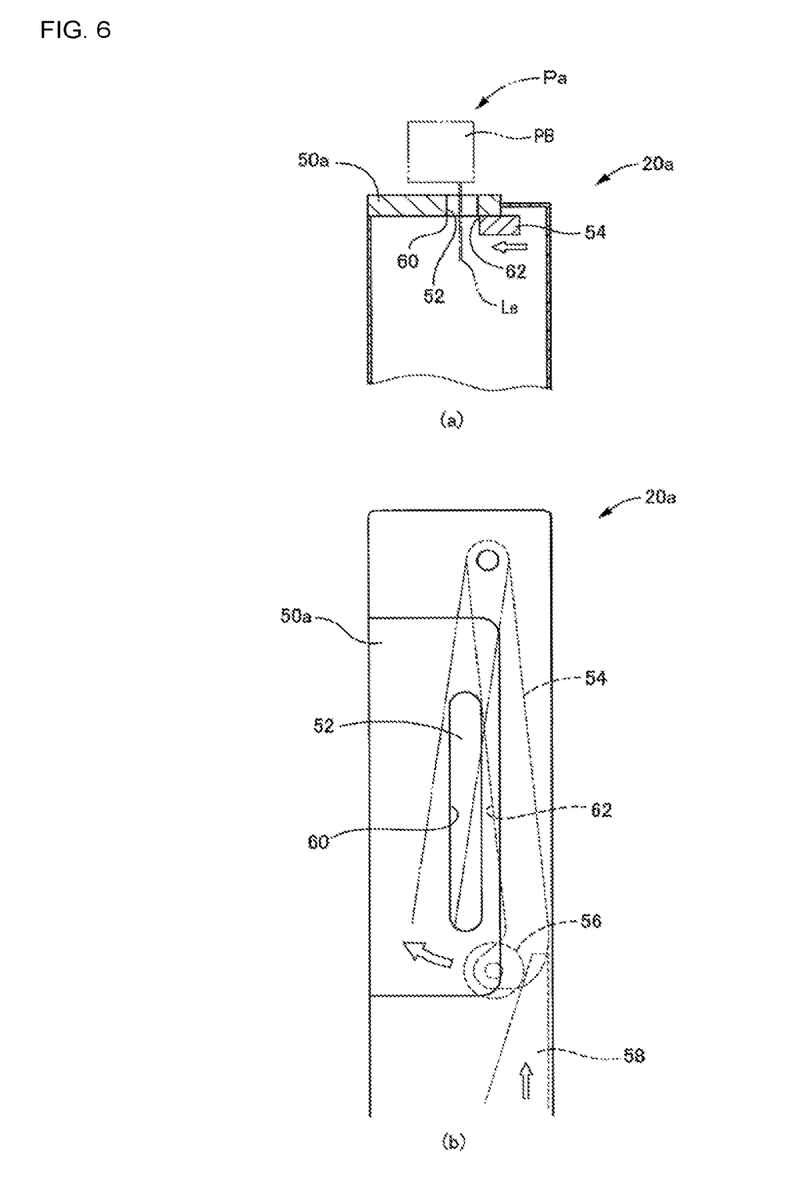
FIG. 6 is a schematic diagram for illustrating a cutting mechanism of a lead cutting device.

Regarding the cutting mechanism of lead cutting device 20, taking lead cutting device 20a as an example, as shown in FIG. 6(a) that is a cross-sectional view of main components and FIG. 6(b) that is a plan view, lead cutting device 20a is provided internally with oscillating bar 54 that swings on the lower side of plate 50a with one end of oscillating bar 54 as a center. As illustrated by FIG. 6(b), roller 56 is supported on the other end of oscillating bar 54, and wedge block 58 is provided to engage with roller 56. Oscillating bar 54 is biased by a spring (not shown) to oscillate in a counter-clockwise direction as shown in FIG. 6, and swings by the advancing and retracting of wedge block 58.

The edge on the lower left side in FIG. 6(a) of through-hole 52 provided in plate 50a (the far side from component main body section PB) functions as fixed blade 60, and the edge on the upper right in FIG. 6(a) of oscillating bar 54 functions as movable blade 62. The state shown in FIG. 6 is a state in which fixed blade 60 and movable blade 62 are open, and by advancing or retracting wedge block 58, oscillating bar 54, that is, movable blade 62, oscillates in a clockwise direction of FIG. 6(a) with respect to through-hole 52, that is, with respect to fixed blade 60.

In a state with fixed blade 60 and movable blade 62 open, as shown in FIG. 6(a), leads Le of component Pa in a posture with plate 50a and component main body section PB facing each other are inserted into through-holes 52, and in that state, oscillating bar 54 is oscillated to close movable blade 62 with respect to fixed blade 60, such that the leads Le are cut by being sheared. Note that, the cut portion of leads Le is received by a cut lead housing box (not shown) attached inside lead cutting device 20a.

Although descriptions of lead cutting devices 20b and 20c are omitted, lead cutting devices 20b and 20c cut leads Le in a similar manner. However, with lead cutting devices 20b and 20c, multiple through-holes 52 into which one lead Le each is inserted are provided, and the edges of each through-hole 52 function as fixed blade 60. Thus, with lead cutting devices 20b and 20c, one movable blade 62 operates with respect to multiple fixed blades 60, whereby the multiple leads Le are cut. Note that, lead cutting device 20a and lead cutting device 20b are different from each other only with respect to plate 50, other components are the same. That is, by changing plate 50, that is, fixed blade 60, according to the component P, lead cutting device 20 can handle various components P. Note that, two-dimensional code 64 is attached to the plate 50 (see FIG. 5), and information obtained by imaging two-dimensional code 64 using imaging device (camera) 66 attached to slide 40 of head moving device 24 is used by control device 26 to grasp which plate 50 is attached to which lead cutting device 20.

[C] Bending of Leads During Cutting and Countermeasures for this

Figure 7:
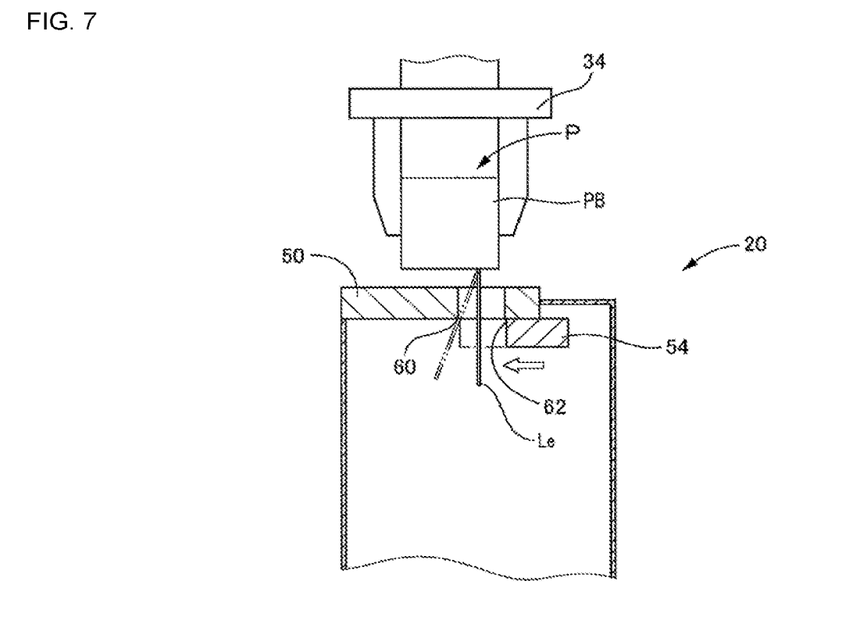
FIG. 7 shows a conventional lead cutting method.

When leads Le of component P are cut by lead cutting device 20, as described earlier, leads Le are cut by being inserted into through-hole 52 provided in plate 50. With conventional cutting, that is, as shown in FIG. 7, it is assumed that the lead Le is positioned in the center of through-hole 52, more specifically, in the center in the X direction, to cut the lead Le. During cutting, plate 50 that forms fixed blade 60 is situated on the side close to component main body section PB and oscillating bar 54 that forms movable blade 62 is situated on the side away from component main body section PB.

In this state, when oscillating bar 54, that is, movable blade 62, is operated to perform cutting, movable blade 62 contacts the lead Le, and movable blade 62 is moved further in that state, and the lead Le is cut after lead Le contacts fixed blade 60. With cutting by such an operation, as shown by the two-dot broken line of FIG. 7, lead Le is cut in a bent state. It is desirable to suppress or prevent this bending because the bending may remain as plastic deformation and may cause excessive force to act on component main body section PB.

Figure 8:
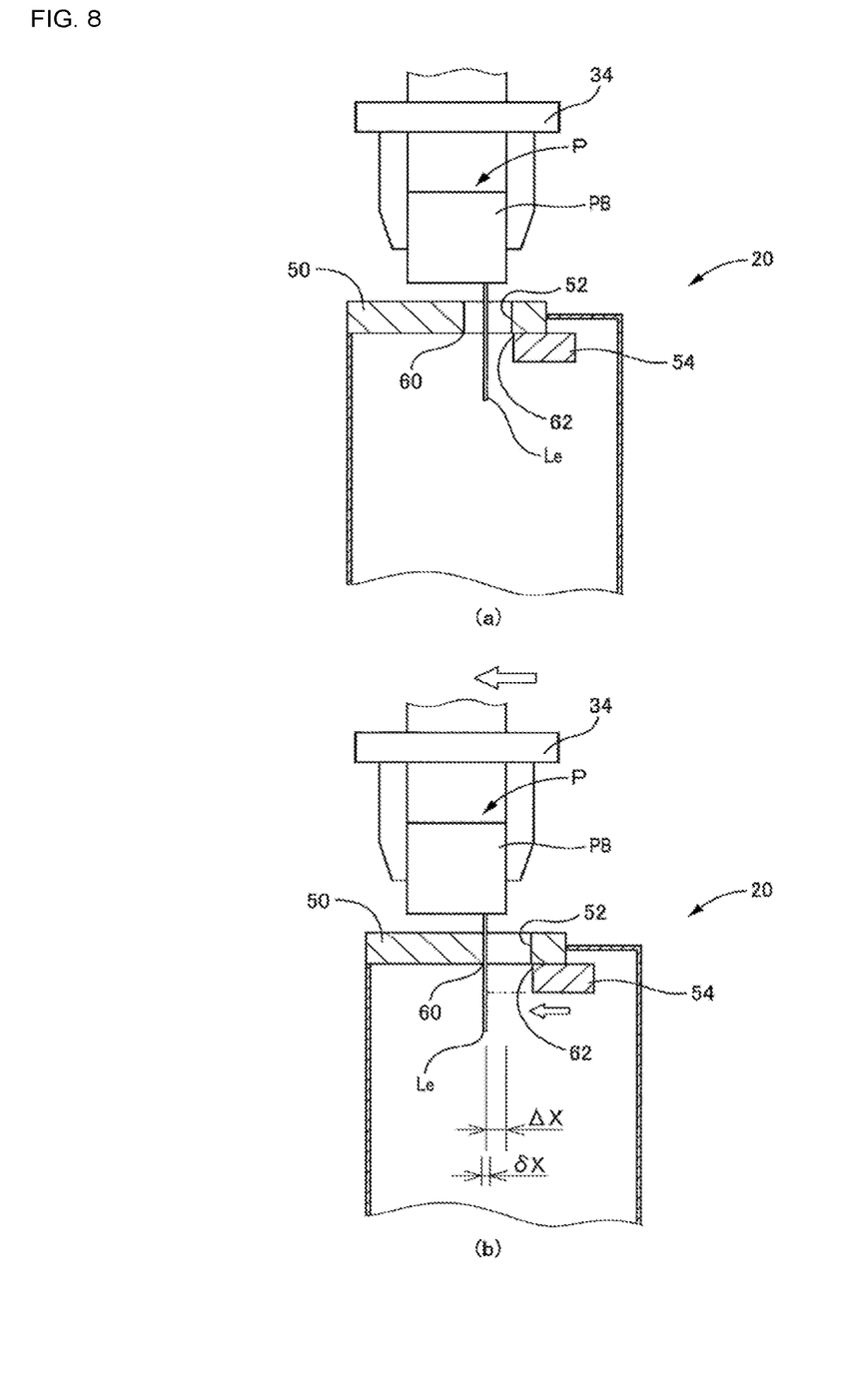
FIG. 8 shows a lead cutting method used in the component mounter of the embodiment.

In view of this, with component mounter 10, as shown in FIG. 8(a), component P is positioned such that lead Le is positioned at the center of through-hole 52, then, as shown in FIG. 8(b), component P is moved to a position where lead Le comes close to or comes into contact with fixed blade 60, such that lead Le is cut at that position. In other words, component P is moved by the moving distance ΔX from a first position in which lead Le is separated from fixed blade 60 by a set distance to a second position in which lead Le comes close to or contacts fixed blade 60, whereat the lead Le, in particular, a portion of the lead Le, is cut. By performing such cutting, bending of the lead Le during cutting is suppressed or prevented. Note that, the method of cutting the lead Le is one aspect of the lead cutting method according to the embodiment of the present disclosure.

The first position and the second position are determined in the initial processing of S2 of the component mounting operation described above. Control device 26 stores a control program of the component mounter for the component mounting operation, that is, a component mounting program in which the position of substrate S to which the component P is to be mounted is specified in the information memory section of the control device itself. Further, the information memory section stores information on the specifications of component P, and the information includes the number of leads Le, lead position information which is information on the position of leads Le on component P, and the like. The information memory section also stores information relating to the specifications of lead cutting device 20, specifically, fixed blade position information which is information relating to the quantity of through-holes 52 of plate 50 and the position of through-holes 52 in lead cutting device 20, that is, the position of fixed blade 60 in lead cutting device 20. When a certain component P is first mounted, initial processing is executed, and in this initial processing the moving distance ΔX at the time of cutting lead Le of component P by lead cutting device 20, that is, the second position, is determined based on the lead position information and the fixed blade position information.

Even if the lead Le is cut based on the moving distance ΔX determined as described above, there is a worry that appropriate cutting cannot be performed due to variations in the position of leads Le in the actual component P or the like. In view of this, control device 26 also has a function to finely adjust the moving distance ΔX, that is, the second position. Specifically, control device 26 receives an input of correction amount δX (refer to FIG. 8) for movement distance ΔX from an operator of component mounter 10, and corrects movement distance ΔX based on the correction amount δX input by the operator. That is, with component mounter 10, the second position can be adjusted by an operator.

[D] Control Device Functions

Figure 9:
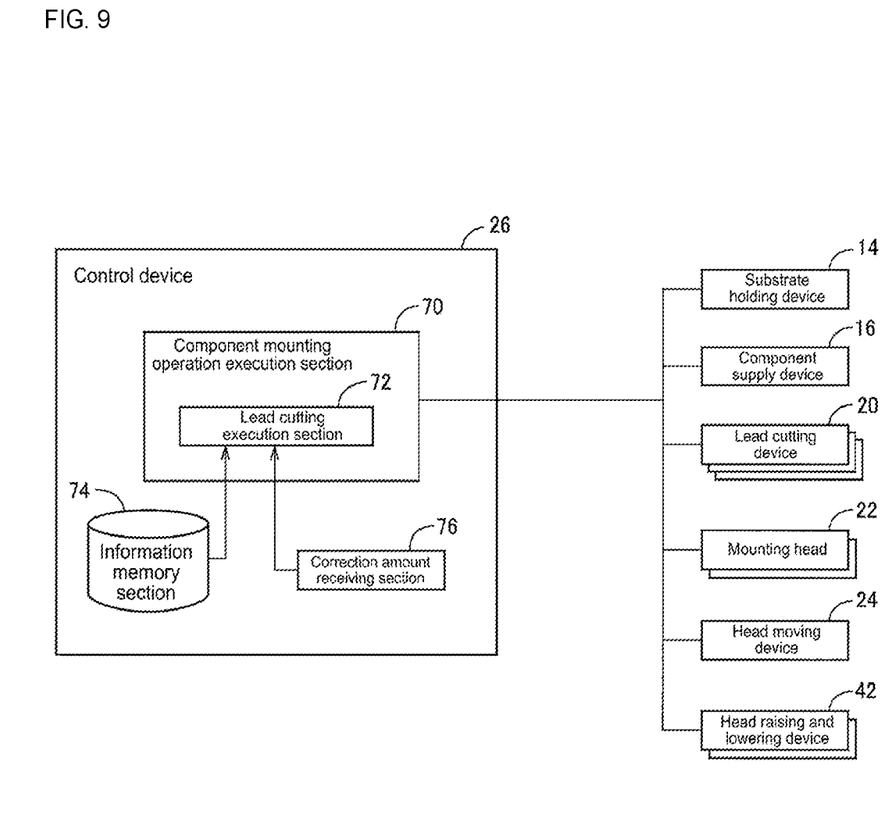
FIG. 9 is a block diagram showing functions of a control device of the component mounter of the embodiment.

From the functions of control device 26 described above, control device 26 can be considered to have a functional configuration as shown in the functional block diagram of FIG. 9. Specifically, control device 26 includes component mounting operation execution section 70 that controls the respective devices such as substrate holding device 14, component supply device 16, lead cutting device 20, mounting head 22, head moving device 24, and head raising and lowering device 42 to execute the component mounting operation described above, and component mounting operation execution section 70 includes lead cutting execution section 72 that causes lead cutting device 20 to cut lead Le by the above-described method.

Also, control device 26 includes an information memory section 74 for storing the lead position information, the fixed blade position information, and the like, and lead cutting execution section 72 is configured to determine the first position and the second position (moving distance ΔX) based on the lead position information and the fixed blade position information stored in information memory section 74. Further, control device 26 includes correction amount receiving section 76 that receives input of correction amount δX by an operator, and lead cutting execution section 72 corrects the second position (moving distance ΔX) based on the correction amount δX received by correction amount receiving unit 76.

REFERENCE SIGNS LIST

10: component mounter (component insertion machine);
14: substrate holding device;
16: component supply device;
20 (20a, 20b, 20c): lead cutting device;
22: mounting head (component holding head);
24: head moving device;
26: control device;
34: component chuck (component holding device);
42: head raising and lowering device;
50 (50a, 50b, 50c): attachment plate;
52: through-hole;
54: oscillating bar;
60: fixed blade;
62: movable blade;
70: component mounting work execution section;
72: lead cutting execution section;
74: information memory section;
76: correction amount receiving section;
S: substrate (board);
H: hole (through-hole);
P (Pa, Pb, Pc): leaded component;
PB: component main body section;
Le: lead

The invention claimed is:

1. A lead cutting method comprising:
   providing a lead cutting device including a plate with a through-hole, a fixed blade provided on an edge of the through hole, and a movable blade;
   holding a leaded component;
   calculating a moving distance of the leaded component from a first position in which the lead is separated from the fixed blade by a set distance to a second position in which the lead is near to or contacting the fixed blade;
   moving the held leaded component so as to move the leaded component so that the lead is inserted into the through-hole and then the lead is moved to the second position; and
   cutting a portion of the lead using the movable blade that faces the fixed blade.

2. The leading cutting method according to claim 1, wherein
   the first position and the second position are determined based on specifications of the leaded component, and a position of the through-hole in the plate.

3. A component insertion machine configured to insert a leaded component into holes provided in a board, the component insertion machine comprising:
   a component supply device configured to supply the leaded components;
   a component holding head configured to pick up and hold the leaded component from the component supply device;
   a head moving device configured to move the component holding head;
   a lead cutting device including a plate with a through-hole, a fixed blade provided on an edge of the through hole, and a movable blade, the lead cutting device configured to cut a portion of a lead of the leaded component using the movable blade that faces the fixed blade; and
   a control device configured to
      calculate a moving distance of the leaded component from a first position in which the lead is separated from the fixed blade by a set distance to a second position in which the lead is near to or contacting the fixed blade,
      control the head moving device to move the leaded component so that the lead is inserted into the through-hole and then the lead is moved to the second position, and
      control the movable blade to cut the lead.

4. The component insertion machine according to claim 3, wherein
   the lead cutting device is configured such that the fixed blade is exchangeable in accordance with the leaded component.

5. The component insertion machine according to claim 3, wherein
   the control device configured to determine the first position and the second position based on specifications of the leaded component, and a position of the through-hole in the plate stored in a memory of the control device.

* * * * *